United States Patent
Sugawara et al.

(10) Patent No.: US 7,402,747 B2
(45) Date of Patent: Jul. 22, 2008

(54) PHOTOELECTRIC CONVERSION DEVICE AND METHOD OF MANUFACTURING THE DEVICE

(75) Inventors: Shin Sugawara, Yohkaichi (JP); Atsuo Hatate, Yohkaichi (JP); Akiko Komoda, Yohkaichi (JP); Hisao Arimune, Yohkaichi (JP)

(73) Assignee: Kyocera Corporation, Kyoto (JP)

( * ) Notice: Subject to any disclaimer, the term of this patent is extended or adjusted under 35 U.S.C. 154(b) by 843 days.

(21) Appl. No.: 10/781,355

(22) Filed: Feb. 18, 2004

(65) Prior Publication Data

US 2004/0206388 A1  Oct. 21, 2004

(30) Foreign Application Priority Data

Feb. 18, 2003 (JP) ............... 2003-040322
Mar. 26, 2003 (JP) ............... 2003-086064

(51) Int. Cl.
*H01L 31/00* (2006.01)
*H02N 6/00* (2006.01)
*E04B 5/48* (2006.01)

(52) U.S. Cl. .................. 136/250; 136/255; 136/243; 52/505

(58) Field of Classification Search ............ 136/243, 136/246, 250, 253
See application file for complete search history.

(56) References Cited

U.S. PATENT DOCUMENTS

| 1,753,721 A * | 4/1930 | Robinson ............... 52/505 |
| 4,322,571 A * | 3/1982 | Stanbery ............... 136/255 |
| 4,454,372 A | 6/1984 | Appleby |
| 4,514,580 A | 4/1985 | Bartlett ................ 136/250 |
| 4,806,495 A | 2/1989 | Levine et al. ........... 437/2 |
| 5,672,214 A * | 9/1997 | Arthur et al. ........... 136/250 |
| 2002/0023674 A1* | 2/2002 | Sugawara et al. ....... 136/243 |
| 2002/0162585 A1* | 11/2002 | Sugawara et al. ....... 136/250 |

FOREIGN PATENT DOCUMENTS

| JP | 03-228379 | 10/1991 |
| JP | 04-207085 | 7/1992 |

(Continued)

OTHER PUBLICATIONS

*Japanese Patent Publication No. 2002-261301 corresponds to U.S. Patent No. 6,653,552.

(Continued)

*Primary Examiner*—Alexa Neckel
*Assistant Examiner*—Asha Hall
(74) *Attorney, Agent, or Firm*—Hogan & Hartson LLP

(57) ABSTRACT

There is disclosed a photoelectric conversion device comprising a substrate 1 serving as a lower electrode; first conductivity-type crystalline semiconductor particles 3 deposited on the substrate; second conductivity-type semiconductor layers 4 formed on the crystalline semiconductor particles 3; an insulator layer 2 formed among the crystalline semiconductor particles; and an upper electrode layer 5 formed on the second conductivity-type semiconductor layers 4, wherein the second conductivity-type semiconductor layers 4 each have a smaller thickness at or below an equator of each of the crystalline semiconductor particles than at a zenith region thereof, and the second conductivity-type semiconductor layers 4 include an impurity element with a concentration gradient decreasing with proximity to the crystalline semiconductor particles.

21 Claims, 8 Drawing Sheets

FOREIGN PATENT DOCUMENTS

| | | |
|---|---|---|
| JP | 2001-313399 | 11/2001 |
| JP | 2001308357 A | 11/2001 |
| JP | 2001-339085 | 12/2001 |
| JP | 2002-076387 | 3/2002 |
| JP | 2002-261301 | 9/2002 |
| JP | 2002-329876 | 11/2002 |
| WO | PCT/JP97/02993 * 8/1997 | ................. 251/460 |

OTHER PUBLICATIONS

**Japanese Patent Publication Nos. 2001-339085 and 2002-076387 corresponds to U.S. Patent No. 6,620,996.

Japanese language office action and its English translation for corresponding Japanese application 2001359376 lists the references above.

* cited by examiner ical damage due to the grinding remains at the PN junction interfaces deteriorating the quality of the PN junction, which leads to degradation of the conversion efficiency. In addition, such a grinding step poses the problem of reduction in productivity.
PHOTOELECTRIC CONVERSION DEVICE AND METHOD OF MANUFACTURING THE DEVICE This application is based on applications Nos. 2003-040322 and 2003-086064 filed in Japan, the content of which is incorporated hereinto by reference.

BACKGROUND OF THE INVENTION

1. Field of the Invention

The present invention relates to photoelectric conversion devices used for solar power generation and the like, and in particular, to a photoelectric conversion device using crystalline semiconductor particles and a method of manufacturing the device.

2. Description of the Related Art

The advent of a resource saving, low cost new generation solar cell has been eagerly awaited. FIG. 9 shows the structure of a conventional photoelectric conversion device using granular or spherical crystalline silicon particles that are advantageous in saving silicon (Refer to Japanese Patent Application Laid-open (Kokai) No. 4-207085(1992), Japanese Patent Application Laid-Open (Kokai) No. 3-228379 (1991)).

The photoelectric conversion device comprises a substrate 1, a low melting point metal layer 8 formed thereon, and first conductivity-type semiconductor particles 3 deposited on the low melting point metal layer 8. An insulator layer 2 is provided to fill the interstices among the semiconductor particles 3. A second conductivity-type amorphous semiconductor layer 4 and a transparent conductive layer 5 are deposited in this order on the semiconductor particles 3.

In the conventional photoelectric conversion device in FIG. 9, the insulator layer 2 on the semiconductor particles 3 is ground so that the semiconductor particles 3 are exposed, and the second conductivity-type amorphous semiconductor layer 4 is formed on the exposed surfaces of the semiconductor particles 3 so as to form PN junction. For this reason, physical damage due to the grinding remains at the PN junction interfaces deteriorating the quality of the PN junction, which leads to degradation of the conversion efficiency. In addition, such a grinding step poses the problem of reduction in productivity.

It is an object of the present invention to provide a photoelectric conversion device with high conversion efficiency and high productivity and a method of manufacturing the device.

BRIEF SUMMARY OF THE INVENTION

A photoelectric conversion device according to the present invention comprises first conductivity-type crystalline semiconductor particles deposited on a substrate and second conductivity-type semiconductor layers formed thereon, wherein the second conductivity-type semiconductor layers each have a smaller thickness at or below an equator of each of the crystalline semiconductor particles than at a zenith region thereof.

By forming the second conductivity-type semiconductor layers so that they are thinner at a lower region of equator of each of the crystalline semiconductor particles than at a zenith region thereof, the zenith regions of the crystalline semiconductor particles that greatly contribute to electric power generation are covered thickly with the second conductivity-type semiconductor layers, so that PN junction can be formed reliably. By forming the semiconductor layers so that they are thinner at the lower regions of the crystalline semiconductor particles, leak current flowing from the upper electrode to the substrate electrode through the semiconductor layers can be minimized. High conversion efficiency can thus be achieved.

When the photoelectric conversion device is arranged such that the semiconductor particles each have an indentation toward the interior thereof at a surface below the equator, because of the presence of the indentations, the second conductivity-type semiconductor layers can be prevented from being formed in the regions below the indentations. Accordingly, leak current flowing from the upper electrode to the substrate electrode through the semiconductor layers can be further reduced.

When the semiconductor particles have rough surfaces, it is possible to form the second conductivity-type semiconductor layers so as to have a smaller thickness at or below the equator than at the zenith region. As a result, reduction of leak current can be accomplished.

In addition, in a photoelectric conversion device according to the present invention, the second conductivity-type semiconductor layers include an impurity element with a concentration gradient decreasing with proximity to the crystalline semiconductor particles.

Providing such an impurity element concentration gradient greatly contributes to reduction of leak current flowing through the second conductivity-type semiconductor layers to the substrate, reduction of surface recombination in the crystalline semiconductor particles and reduction of series resistance between the upper electrode layer and the second conductivity-type semiconductor layers. Accordingly, high conversion efficiency and high reliability can be achieved.

It is also possible to form an oxide layer or a nitride layer between the crystalline semiconductor particles and the second conductivity-type semiconductor layers. In this case, due to a tunnel phenomenon, carriers are allowed to move through the oxide or nitride layer.

A method of manufacturing a photoelectric conversion device according to the present invention comprises the steps of: depositing first conductivity-type crystalline semiconductor particles on a substrate serving as a lower electrode; forming second conductivity-type semiconductor layers on the crystalline semiconductor particles so that at least one trace element selected from the group consisting of p-type or n-type impurities, oxygen, nitrogen, carbon and hydrogen is included in the layers with a concentration gradient increasing with thickness; forming an insulator layer among the crystalline semiconductor particles; and forming an upper electrode layer on the second conductivity-type semiconductor layers.

In the photoelectric conversion device fabricated by the foregoing method, the second conductivity-type semiconductor layers include the impurity element with a concentration gradient decreasing with proximity to the crystalline semiconductor particles. Providing such an impurity element concentration gradient greatly contributes to improving adhesion between the second conductivity-type semiconductor layers and the insulator layer and improving adhesion between the second conductivity-type semiconductor layers and the upper electrode layer. Accordingly, high conversion efficiency and high reliability can be achieved.

The method of manufacturing a photoelectric conversion device according to the present invention is advantageously arranged such that the surfaces of the crystalline semiconductor particles are covered with the second conductivity-type semiconductor layers so as to reduce surface recombination, thereby improving the conversion efficiency.

In the method of manufacturing a photoelectric conversion device according to the present invention, the second conductivity-type semiconductor layers are formed prior to the formation of the insulator layer, thereby avoiding inconveniences that may arise when the second conductivity-type semiconductor layers are formed after the formation of the insulator layer, such as that the area of PN junction is determined by the configuration of the insulator layer, and that the quality of the PN junction deteriorates due to the insulator layer acting as a pollutant in the process of forming the second conductivity-type semiconductor layers.

The method of manufacturing a photoelectric conversion device according to the present invention preferably includes, prior to forming the insulator layer among the crystalline semiconductor particles, the step of removing a part of the second conductivity-type semiconductor layers that adheres to the substrate after the formation of the second conductivity-type semiconductor layers. This is because if the second conductivity-type semiconductor layers are formed not only on the crystalline semiconductor particles but also on the insulator layer, light absorption loss becomes great and the amount of light incident on the crystalline semiconductor particles is reduced, which is unfavorable.

DETAILED DESCRIPTION OF THE INVENTION

<First Embodiment>

Figure 1:
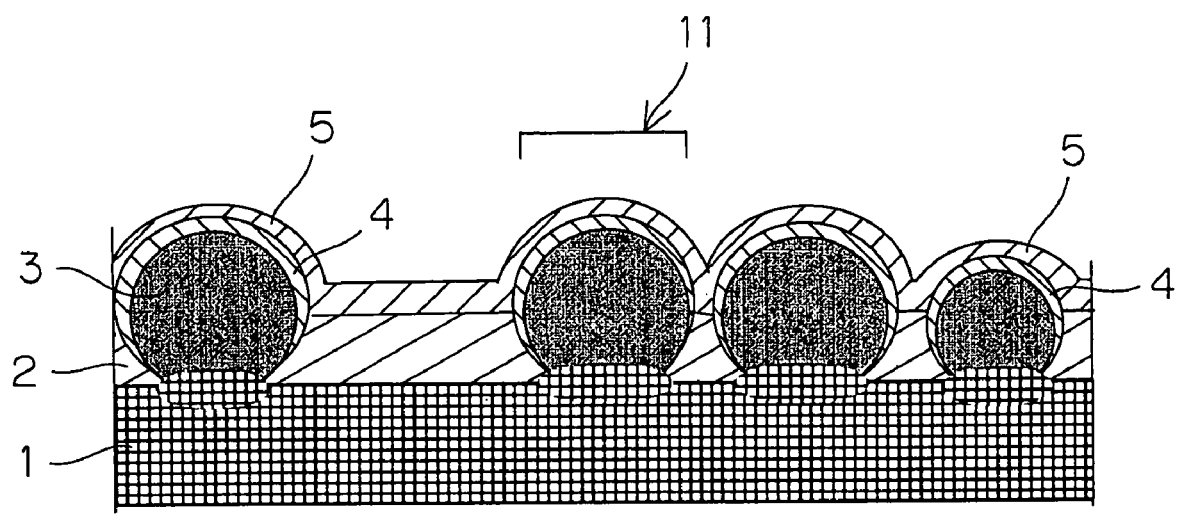
FIG. 1 is a cross-sectional view showing the structure of a photoelectric conversion device according to the present invention.

FIG. 1 is a cross-sectional view showing one embodiment of the photoelectric conversion device according to the present invention. There are shown a substrate 1, an insulator layer 2, first conductivity-type crystalline semiconductor particles 3, second conductivity-type semiconductor layers 4, an upper electrode layer 5 and a granular photoelectric conversion element 11.

A metal or an insulator is used for the substrate 1. The insulator may be glass, ceramics, resin or the like. When an insulator is employed for the substrate 1, a conductive layer serving as a lower electrode needs to be formed on a surface of the substrate 1. The metal for the substrate 1 is preferably a high reflectance metal with high conductivity that strongly reflects light, which is, for example, silver, aluminum, copper or the like.

The substrate 1 preferably has a great reflectance so that a greater amount of light reflected by the substrate 1 can be directed to the crystalline semiconductor particles 3, resulting in an improved conversion efficiency.

In particular, the substrate 1 preferably comprises aluminum or an aluminum alloy. When the second conductivity-type semiconductor layers 4 are formed on the crystalline semiconductor particles 3, the semiconductor layers 4 are formed also on the substrate 1. These semiconductor layers 4 on the substrate 1 can be removed by a treatment using hydrofluoric acid, hydrochloric acid, sulfuric acid or phosphoric acid in cases where the substrate 1 comprises aluminum or an aluminum alloy. This is because the second conductivity-type semiconductor layers 4 formed on the substrate 1 can be removed together with the surface layer of the substrate 1 by etching the substrate 1 comprising aluminum or an aluminum alloy. For this reason, it is preferable that the substrate 1 comprises aluminum or an aluminum alloy.

In addition, the surface of the substrate 1 is preferably a rough surface, because if the surface of the substrate 1 is not rough, it is difficult to remove the second conductivity-type semiconductor layers 4 formed on the substrate 1.

The insulator layer 2 is formed among the crystalline semiconductor particles 3 so as to separate the positive electrode from the negative electrode. Glass materials, resin materials, organic-inorganic composite materials and the like maybe used for the insulating layer. The insulator layer 2 is formed after the second conductivity-type semiconductor layers 4 are formed on the surfaces of the crystalline semiconductor particles 3. The individual second conductivity-type semiconductor layers 4 are interconnected to one another by the upper electrode layer 5. Forming PN junction before the formation of the insulator layer 2 advantageously makes it possible to spare the step of removing the insulator layer 2 from the surfaces of the crystalline semiconductor particles 3. Furthermore, since it eliminates occurrence of surface defects in the crystalline semiconductor particles 3 caused by removal of the insulator layer 2 and pollution by the insulator layer 2, there will be no degradation in quality of the PN junction, so that high conversion efficiency can be achieved.

The insulator layer 2 preferably has a light transmittance of 70% or more at wavelengths of 400 nm-1200 nm. It is unfavorable that the light transmittances is less than 70%, because in such a case, the amount of light incident on the crystalline semiconductor particles 3 is reduced, thereby lowering the conversion efficiency.

The crystalline semiconductor particles 3 comprise silicon, germanium or the like. The semiconductor particles 3 may be doped with a p-type or n-type impurity such as B, P, Al, As, Sb or the like.

Although the crystalline semiconductor particles 3 may be formed by various methods including a vapor-phase growth method, atomizing method, DC plasma method and the like, they are preferably formed by a melt-drop method in which a molten semiconductor solution is dropped in a non-contact fashion. In addition, it is preferred that the first conductivity-type crystalline semiconductor particles 3 are p-type. For example, the particles include $1 \times 10^{14}$ to $1 \times 10^{18}$ atoms/cm$^3$ of B or Al added thereto".

Figure 2:
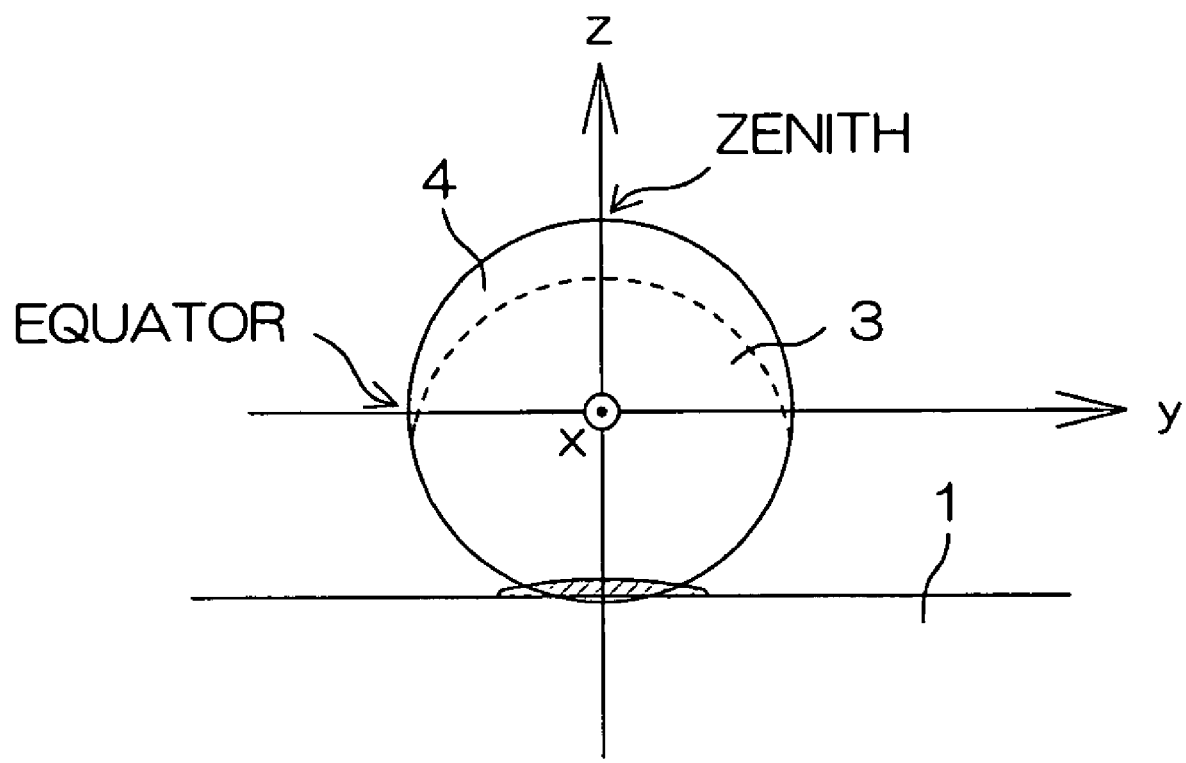
FIG. 2 illustrates the coordinate system of a crystalline semiconductor particle.

Now, an "equator" is defined as an outline of the crystalline semiconductor particle 3 in a plane view, and a "zenith" is defined as a top point of the particle 3. If a shape of the crystalline semiconductor particle 3 is sphere, the coordinate system of the crystalline semiconductor particles 3 is defined referring to FIG. 2. Assume that the center of a crystalline semiconductor particle 3 is the origin, and the direction perpendicular to the substrate is represented by z. The directions perpendicular to z are represented by x and y, where x and y run parallel to the surface of the substrate 1. The line on the crystalline semiconductor particle 3 located at z=0 is referred to as the "equator". The point on the surface of the crystalline semiconductor particle 3 where z>0 and x=y=0 is referred to as the "zenith". Regions of the crystalline semiconductor particle 3 between the equator and the substrate in the vicinity of the substrate 1 are referred to as the "lower region" of the semiconductor particle 3.

Figure 3:
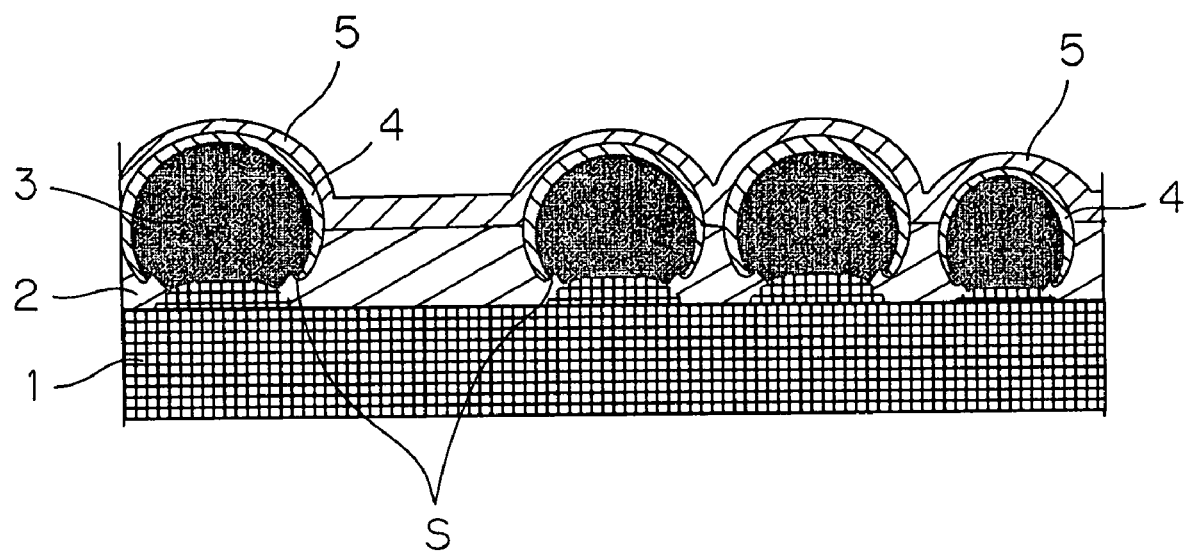
FIG. 3 is a cross-sectional view showing a structure of a photoelectric conversion device according to the present invention in which indentations are provided.

As shown in FIG. 3, it is preferred that an indentation S be provided toward the interior of the particle on a surface below the equator of the crystalline semiconductor particle 3. Providing the indentation S toward the interior of the particle on a surface lower than the equator of the crystalline semiconductor particle 3 can prevent the semiconductor layer 4 from being formed in regions lower than the indentation S. That is, the semiconductor layer 4 formed on the surface of the crystalline semiconductor particle 3 has the largest thickness at the zenith, and gradually becomes thinner as it extends downward from the zenith until the thickness is almost zero at a position below the indentation S.

Providing the indentation S allows the semiconductor layer 4 to disappear at an intermediate point between the zenith of the semiconductor particle 3 and the substrate 1. Accordingly, electrical separation between the upper electrode layer 5 and the substrate 1 can be reliably accomplished. This is favorable because owing to the electrical separation, leak current flowing through the second conductivity-type semiconductor layer 4 to the lower electrode can be reduced.

Methods for forming the indentation toward the interior of the particle on the crystalline semiconductor particle 3 include the following: (1) After joining the semiconductor particles 3 to the substrate 1, a resist film is applied on the surfaces of the semiconductor particles 3, and then selective etching is carried out; (2) After joining the semiconductor particles 3 to the substrate 1, the substrate 1 itself is selectively etched.

Figure 4:
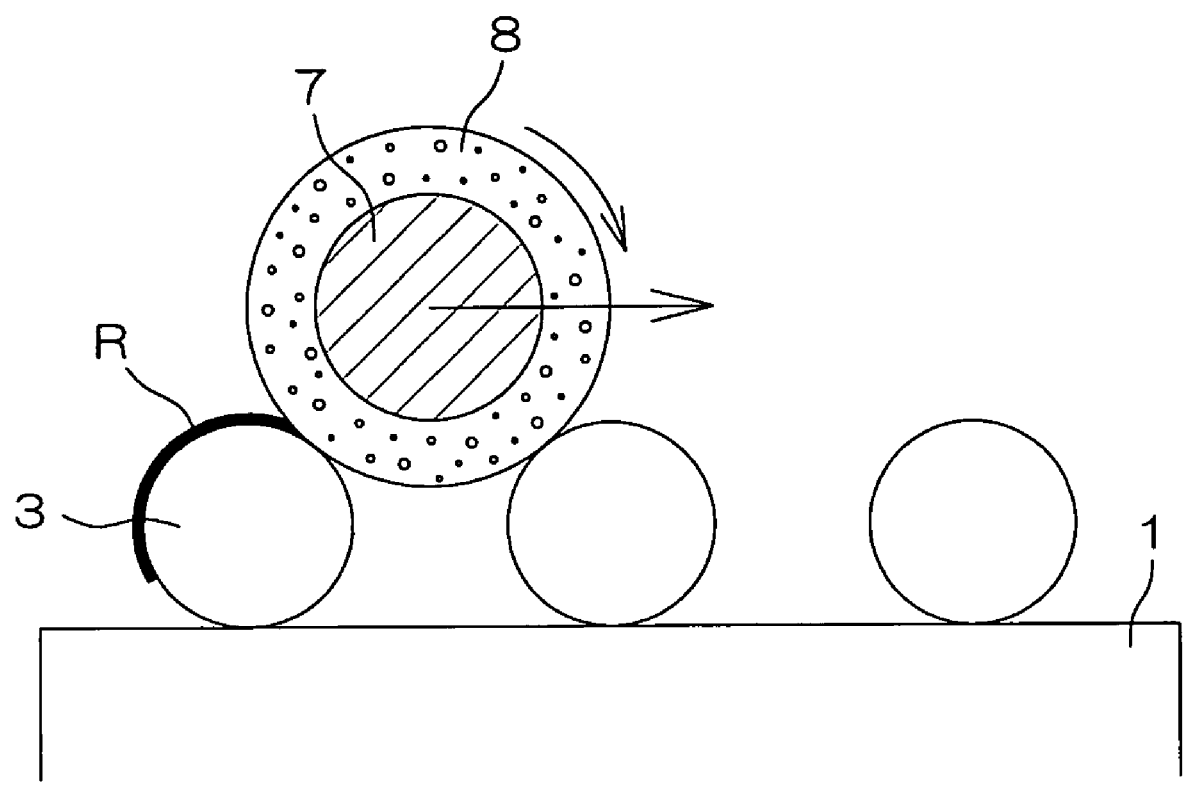
FIG. 4 is a cross-sectional view for illustrating a method for applying a resist film on the surfaces of semiconductor particles 3.

FIG. 4 is a cross-sectional view for illustrating the method (1) for applying a resist film on the surfaces of the semiconductor particles 3. A Roll Coater comprising a roller shaft 7 made of hard metal or the like that is covered with a porous, soft material as a sponge 8 containing a liquid resist absorbed therein is rolled over the surfaces of the semiconductor particles 3. As a result, the liquid resist is applied on relatively upper surfaces of the semiconductor particles 3. After the liquid resist is dry, the whole is dipped into an etching solution for etching semiconductor such as silicon so as to remove the lower surfaces of the semiconductor particles 3 that are not coated with the resist film. In this way, indentations are formed in the lower regions of the semiconductor particles 3.

Preferably, the indentations are formed on the semiconductor particles 3 after the second conductivity-type semiconductor layers 4 are formed on the surfaces of the semiconductor particles 3. This is because the semiconductor layers 4 that are formed below the indentations on the semiconductor particles 3 are removed upon formation of the indentations.

Alternatively, the indentations may be provided before forming the semiconductor layers 4 on the surfaces of the semiconductor particles 3. The semiconductor layers 4 are hard to be formed inside the indentations after the indentations are provided on the semiconductor particles 3.

Figure 5:
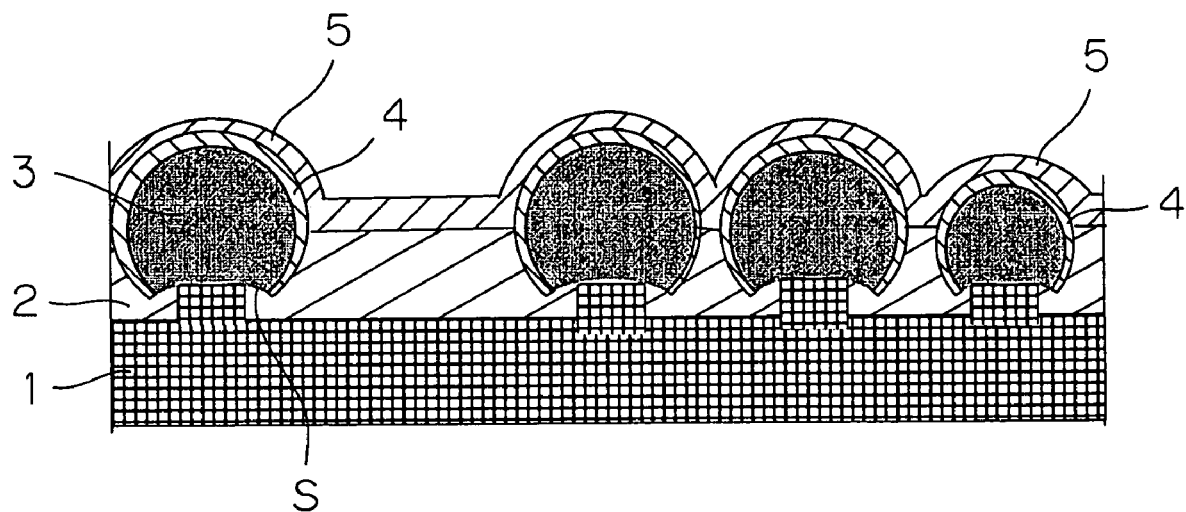
FIG. 5 is a cross-sectional view showing another structure of the photoelectric conversion device according to the present invention in which indentations are provided.

FIG. 5 is a cross-sectional view showing indentations provided by the method (2) in which the substrate 1 itself is selectively etched after the semiconductor particles 3 are joined to the substrate 1. The selective etching may be carried out before or after the formation of the second conductivity-type semiconductor layers 4 on the surfaces of the semiconductor particles 3.

In cases where the selective etching is carried out after the formation of the second conductivity-type semiconductor layers 4 on the surfaces of the semiconductor particles 3, the second conductivity-type semiconductor layers 4 are formed on the surfaces of the semiconductor particles 3 after the semiconductor particles 3 are joined to the substrate 1. The semiconductor layers 4 are formed also on the substrate 1. Thereafter, the whole is dipped into an etching solution for etching aluminum.

In cases where selective etching is carried out before forming the second conductivity-type semiconductor layers 4 on the surfaces of the semiconductor particles 3, after the semiconductor particles 3 are joined to the substrate 1, the whole is dipped into an etching solution for etching aluminum.

Hydrofluoric acid, nitric acid, hydrochloric acid, sulfuric acid, phosphoric acid or the like may be used for the etching solution. As a result, not only aluminum in the surface of the substrate 1 is etched, but also the aluminum-silicon eutectic portions in the lower regions of the semiconductor particles 3 are etched, thereby causing indentations to appear in the lower regions of the semiconductor particles 3. The parts denoted by S in FIG. 5 represent indentations formed in this manner.

Meanwhile, in cases where selective etching is carried out after forming the semiconductor layers 4 on the semiconductor particles 3, the part of the semiconductor layers 4 remaining on the substrate 1 is removed simultaneously with the etching of aluminum.

The reason for the inconvenience of the semiconductor layers 4 remaining on the surface of the substrate 1 is as follows. Light incident on the substrate 1 is partly utilized after it is reflected from the substrate 1 and enters the semiconductor. However, if the semiconductor layers 4 are formed on the substrate 1, the amount of light reflection is reduced resulting in a loss of light-generated current.

Figure 6:
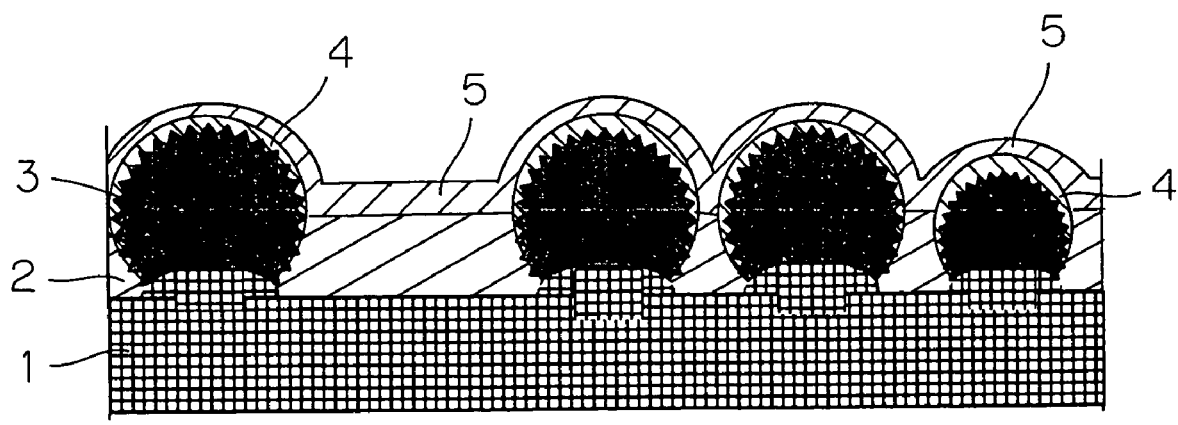
FIG. 6 is a cross-sectional view showing another structure of the photoelectric conversion device according to the present invention.

The surfaces of the crystalline semiconductor particles 3 are preferably rough as shown in FIG. 6. Arithmetic surface roughness (Ra) thereof is preferably 0.01 µm or more, and 5 µm or less. Roughening the surfaces of the crystalline semiconductor particles 3 is advantageous because it makes it possible to form the films of the semiconductor layers 4 to be thinner at the lower regions of the semiconductor particles 3. The method for roughening the surfaces of the semiconductor particles 3 may be dry etching by means of RIE, selective wet etching with use of sodium hydroxide or the like, sandblasting or the like.

The second conductivity-type semiconductor layers 4 are formed by a plasma CVD method, catalytic CVD method, sputtering or the like.

Figure 7:
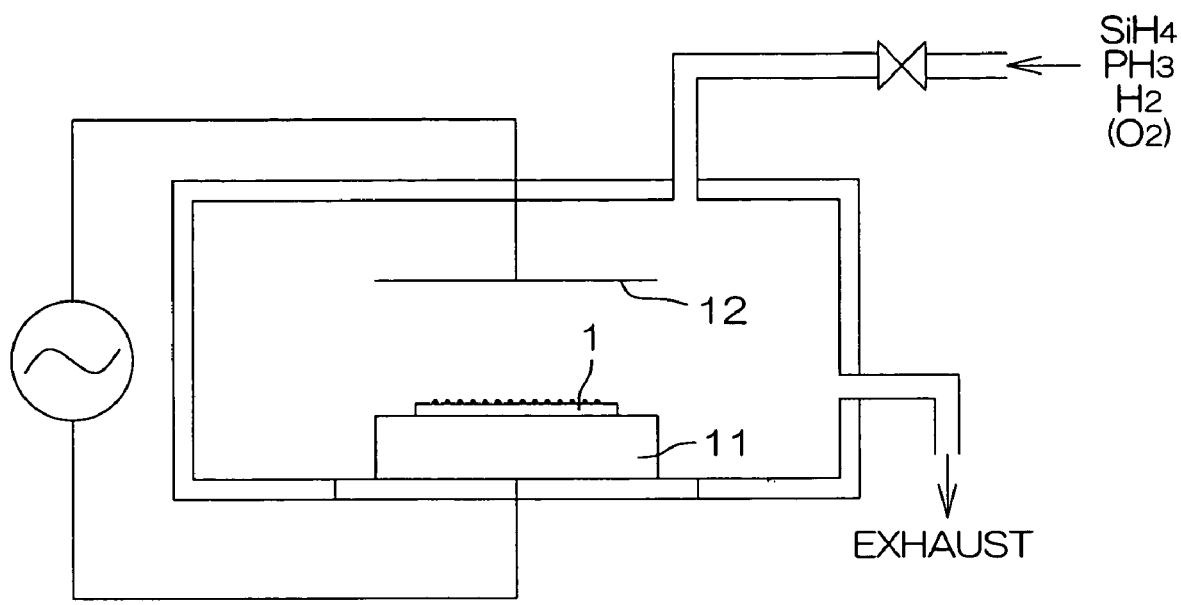
FIG. 7 is a cross-sectional view of a plasma-CVD apparatus used in the manufacture of a photoelectric conversion device according to the present invention.

FIG. 7 is a cross-sectional view of a plasma CVD apparatus used in the manufacture of a photoelectric conversion device according to the present invention. A stage 11 for mounting a substrate 1 and an electrode 12 opposed to the stage 11 are situated in a plasma chamber. Gases such as $SiH_4$, $PH_3$ and the like are introduced into the plasma chamber, and an RF electric field is applied. Second conductivity-type semiconductor layers 4 can thus be formed on the crystalline semiconductor particles 3. The crystal structure of the semiconductor layers 4 may be amorphous, microcrystalline or nanocrystalline.

The semiconductor layers 4 are each formed so as to have a smaller thickness at a region lower than the equator of each of the crystalline semiconductor particles 3 than that at a zenith region thereof.

In order to form a semiconductor layer 4 so as to have a smaller thickness at the region lower than the equator than that at the zenith region, the film growth is controlled to have directionality. Specifically, directionality is more readily attained as the degree of vacuum increases and the RF power increases in the deposition process.

Effects obtained by providing directionality to the film growth so that the semiconductor layers 4 each have a smaller thickness at the region lower than the equator than that at the zenith region are described as follows. By forming the semiconductor layers 4 to be thicker at the zenith regions of the semiconductor particles 3 that greatly contribute to powder generation, reliable PN junction can be formed, as well as by forming the semiconductor layers 4 to be thinner at the lower regions of the semiconductor particles 3, leak current flowing through the semiconductor layers 4 to the lower electrode 1 can be reduced. Accordingly, high conversion efficiency can be achieved.

It is preferred that the second conductivity-type semiconductor layers 4 each have a thickness of not less than 5 nm and not more than 100 nm at the zenith region. It is unfavorable that the second conductivity-type semiconductor layers 4 have a thickness of less than 5 nm, because at such a thickness, the films of the second conductivity-type semiconductor layers 4 form islands on the surfaces of the semiconductor particles 3 leaving inadequately covered areas. It is also unfavorable that the second conductivity-type semiconductor layers 4 have a thickness of more than 100 nm, because at such a thickness, not only leak current flowing through the second conductivity-type semiconductor layers 4 to the lower electrode increases, but also the amount of light absorbed by the second conductivity-type semiconductor layers 4 increases, resulting in degradation of the conversion efficiency.

In addition, each of the semiconductor layers 4 preferably has a difference in thickness on each of the semiconductor particles 3 between the upper and lower regions thereof.

Figure 8:
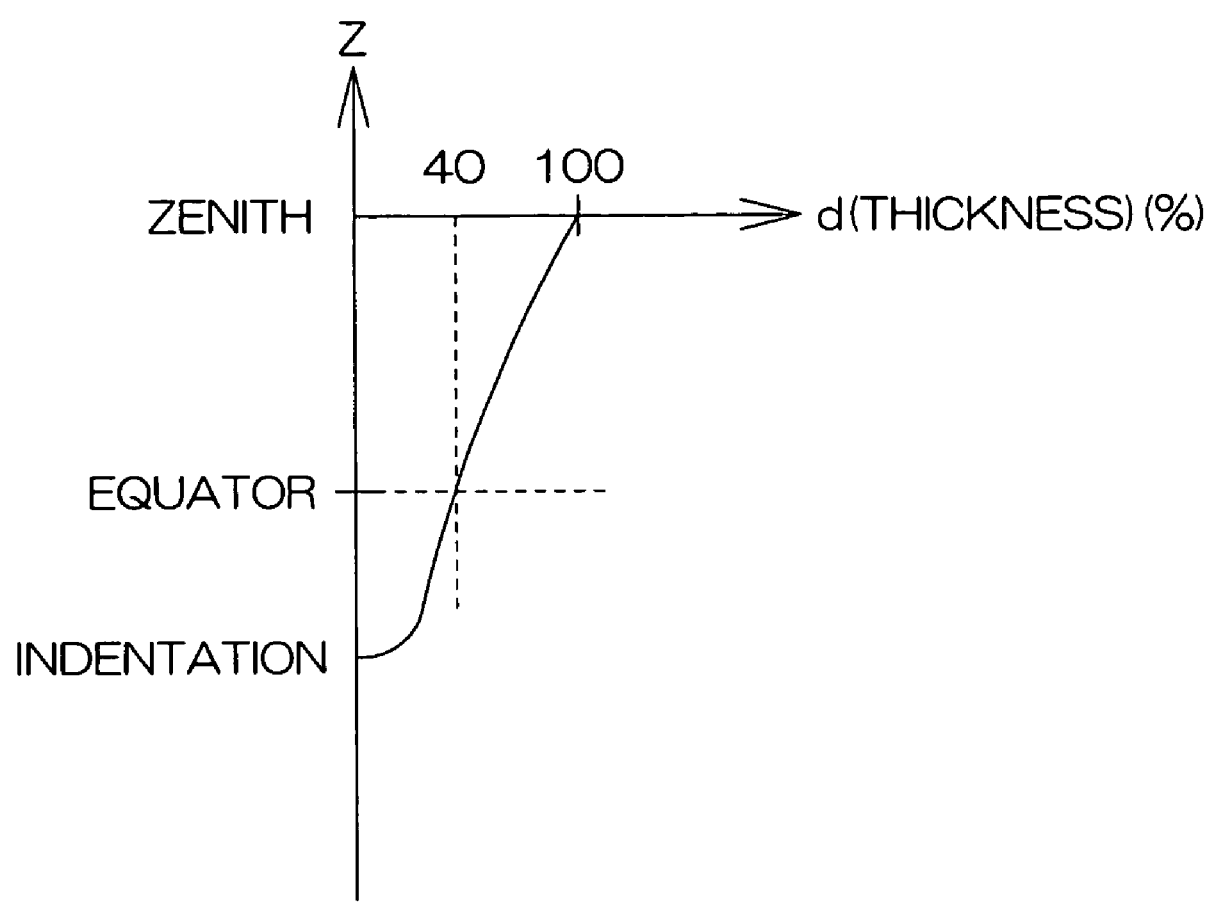
FIG. 8 is a graph showing a thickness distribution of a semiconductor layer.
Figure 9:
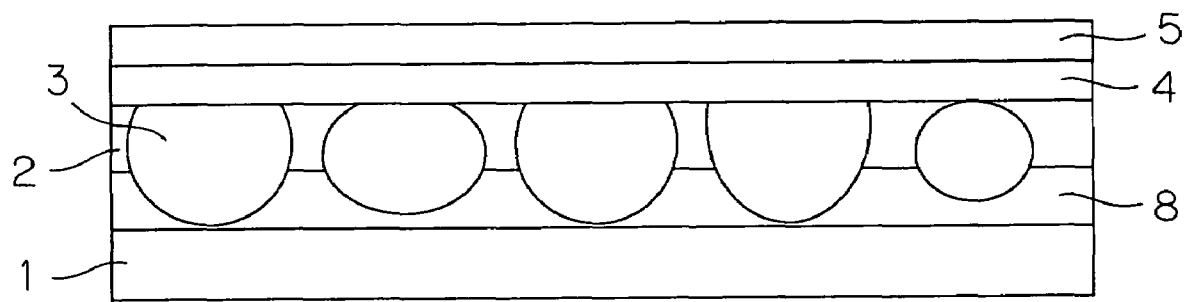
FIG. 9 is a cross-sectional view showing a conventional photoelectric conversion device.

FIG. 8 is a graph showing a thickness distribution of a semiconductor layer 4 when the shape of the semiconductor particles 3 is sphere. The vertical axis represents the vertical direction z and the horizontal axis represents thickness d.

The thickness at a region lower than the equator is preferably 70% or less of that at the zenith region, and more preferably, 40% or less as shown in FIG. 8. By forming the thicknesses of the lower regions to be thinner, leak current flowing through the semiconductor layers 4 to the lower electrode can be minimized.

Furthermore, it is preferred that an oxide layer or a nitride layer be formed between each of the crystalline semiconductor particles 3 and the semiconductor layers 4.

It has been found that forming a several dozen Å semiconductor oxide layer or semiconductor nitride layer between each of the crystalline semiconductor particles 3 and semiconductor layers 4 caused a tunnel phenomenon to occur, which enabled carriers to move. Although it resulted in increased short circuit current, this is considered to be due to reduction of surface recombination in the crystalline semiconductor particles 3.

A description will be given below of concentration of trace elements included in the semiconductor layers 4. The "trace element" refers to one or a plurality of elements added to the semiconductor material that are selected from the group consisting of p-type or n-type impurity elements (B, P, Al As, Sb, etc.), oxygen, nitrogen, carbon and hydrogen.

The semiconductor layers 4 are preferably formed so that the concentration of the trace element decreases with proximity to the crystalline semiconductor particles 3, and gradually increases with thickness.

Forming the second conductivity-type semiconductor layers 4 to have a lower trace element concentration on the side of the crystalline semiconductor particles 3 has the following effects: reduction of leak current flowing through the semiconductor layers 4 to the substrate 1, reduction of surface recombination in the crystalline semiconductor particles 3, improvement of adhesion to the insulator layer 2, improvement of adhesion to the upper electrode layer 5 and reduction of series resistance between the upper electrode layer 5 and the semiconductor layers 4.

In particular, when a concentration gradient of B, P, Al, As, or Sb is provided, significant effects are obtained in terms of reduction of leak current flowing through the semiconductor layers 4 to the substrate 1, reduction of surface recombination in the crystalline semiconductor particles 3, and reduction of series resistance between the upper electrode layer 5 and the semiconductor layers 4.

When a concentration gradient of oxygen, nitrogen, carbon or hydrogen is provided, significant effects are obtained in terms of improvement of adhesion to the insulator layer 2 and improvement of adhesion to the upper electrode layer 5.

The semiconductor layers 4 preferably have trace element concentrations of, for example, about $5 \times 10^{15}$-$5 \times 10^{19}$ atoms/cm$^3$ on the side of the crystalline semiconductor particles 3, and $1 \times 10^{18}$-$5 \times 10^{21}$ atoms/cm$^3$ on the side of the upper electrode layer 5, respectively.

The trace element concentration may be arranged such that the semiconductor layers 4 each comprise an intrinsic semiconductor (with no impurity) on the lower concentration side.

As a method for controlling trace element concentration, there is a method in which a gas containing a trace element is added in forming the semiconductor layers 4. In this method, when depositing the semiconductor layers 4, the concentration of $PH_3$ is at a low level at the beginning of introduction thereof into the plasma chamber and then gradually increased.

Also, there is another method which involves carrying out heat treatment in an atmosphere containing a trace element after the formation of the semiconductor layers 4.

The upper electrode layer 5 is formed by depositing tin oxide, indium oxide or the like by means of sputtering or the like. It is possible to provide the layer with an antireflection effect by controlling the thickness and index of refraction. An auxiliary electrode may further be formed thereon with an appropriate pattern using silver or copper paste.

While some specific embodiments of the present invention have been heretofore described, implementation of the present invention is not limited to the forgoing embodiments. For example, the photoelectric conversion device according to the present invention is not limited to single-junction photoelectric conversion devices but also applicable to photoelectric conversion devices with a plurality of junctions. Such a photoelectric conversion device with a plurality of junctions may be, for example, a tandem-type photoelectric conversion device comprising p-type crystalline semiconductor particles, an n-type microcrystalline semiconductor layer formed thereon, and an intermediate layer on which a p-type amorphous semiconductor layer, an i-type amorphous semiconductor layer and an n-type amorphous semiconductor layer are successively stacked. Various other modifications may also be made within the scope of the present invention.

EXAMPLE

Hereinafter, the present invention will be described by way of examples and comparative examples.

Example 1

First, p-type crystalline silicon particles 3 with an average particle size of 400 μm were densely placed to form a layer on an aluminum substrate 1, which were then heated at 590-600° C. so that the crystalline semiconductor particles 3 were joined to the substrate 1.

Subsequently, with a substrate temperature of 250° C., n-type microcrystalline semiconductor layers 4 were formed over the silicon particles 3 from the zenith regions to lower regions thereof by a plasma CVD method. In this process, a pressure in the formation of the layer 4 of 150-300 Pa, and a power of 50-300W was applied to an electrode 12 of the plasma CVD apparatus so that directionality in film growth was caused. As a result, the semiconductor layers 4 each had the largest thickness at the zenith region and a thickness smaller than that at the lower region.

Then, epoxy resin was provided among the silicon particles 3 and cured to form an insulator layer 2, on which a 100 nm upper electrode layer 5 comprising ITO was formed. Thereafter, conversion efficiency was measured, the results of which are shown in Table 1. Table 1 shows relationships between the thickness of the n-type polycrystalline semiconductor layer 4 and the conversion efficiency of the semiconductor devices fabricated in various conditions as above.

TABLE 1

| Sample No. | Thickness of semiconductor layer 4 at zenith region (nm) | Thickness of semiconductor layer 4 at lower region (nm) | Pressure (Pa) | Power (W) | Conversion efficiency (%) |
|---|---|---|---|---|---|
| 1 | 3 | 1.5 | 150 | 50 | 10.7 |
| 2 | 10 | 5 | 200 | 200 | 11.1 |
| 3 | 40 | 20 | 300 | 150 | 10.9 |
| 4 | 80 | 30 | 200 | 100 | 10.6 |
| 5 | 1 | 0.5 | 250 | 150 | 8.8 |
| 6 | 200 | 100 | 150 | 300 | 8.2 |
| 7 | 40 | 10 | 200 | 150 | 11.4 |
| 8 | 40 | 5 | 150 | 200 | 11.5 |
| 9* | 40 | 40 | 300 | 100 | 5.3 |

*Sample No. 9 is out of the scope of the present invention.

Also, forming silicon particles 3 on the substrate with the conditions of a pressure of the plasma CVD apparatus being 300 Pa, and film-formation power being 100 to 200W, a sample device having a thickness of the semiconductor layer 4 of 50 nm, and indentations S toward the interior of the particles was fabricated by etching with hydrofluoric acid and nitric acid. Also, a sample device with the surfaces of crystalline silicon particles being roughened was fabricated. The results of measurements of conversion efficiency are shown in Table 2.

TABLE 2

| Sample No. | Thickness of semiconductor layer 4 at lower region of crystalline silicon particle (nm) | Surface profile of silicon particles | Conversion efficiency (%) |
|---|---|---|---|
| 11 | 35 | No indentation | 10.3 |
| 12 | 30 | No indentation | 10.5 |
| 13 | 20 | No indentation | 12.1 |
| 14 | 10 | No indentation | 12.2 |
| 15* | 40 | No indentation | 6.2 |
| 16* | 50 | No indentation | 5.7 |
| 17* | 60 | No indentation | 3.4 |
| 18 | 2 | Indented | 12.9 |
| 19 | 5 | Roughened | 12.7 |

*Samples Nos. 15, 16 and 17 are out of the scope of the present invention.

As is apparent from the results above, high conversion efficiencies are achieved by forming the region lower than equator of the semiconductor layers to be thinner (70% or less) than the zenith thereof. More preferably, the thickness of the region lower than equator is 40% or less of that of the zenith. Still more preferably, the crystalline silicon particles are formed so that the surfaces thereof each have an indentation toward the interior of the particle. It is also preferable that the surfaces of the crystalline silicon particles are roughened.

Example 2

P-type crystalline silicon particles 3 with an average particle size of 400 μm were densely placed to form a layer on an aluminum substrate 1, which were then heated at 590-600° C. so that the crystalline semiconductor particles 3 were joined to the substrate 1.

Subsequently, with a substrate temperature of 200° C., 40 nm thick, n-type amorphous semiconductor layers 4 were formed by a plasma CVD method. The phosphorus concentration in the semiconductor layers 4 was varied in the direction of thickness by regulating the amount of phosphine gas for doping. Then, epoxy resin was provided among the silicon particles 3 and cured to form an insulator layer 2, on which a 100 nm upper electrode layer 5 comprising ITO was formed. Thereafter, conversion efficiency was measured. Also, with the conditions being the same, a sample device with the surfaces of the crystalline silicon particles 3 being roughened was fabricated and evaluated. In addition, a sample device with the silicon particles each having an indentation toward the interior of the particle was fabricated and evaluated. The results of these are shown in Table 3.

TABLE 3

| Sample No. | Phosphorus concentration in n-type semiconductor layer 4 on the side of semiconductor particle (atoms/cm$^3$) | Phosphorus concentration in n-type semiconductor layer 4 on the side of upper electrode layer (atoms/cm$^3$) | Conversion efficiency (%) |
|---|---|---|---|
| 21 | $1 \times 10^{16}$ | $1 \times 10^{20}$ | 11.3 |
| 22 | $1 \times 10^{16}$ | $5 \times 10^{20}$ | 11.5 |
| 23 | $1 \times 10^{16}$ | $1 \times 10^{21}$ | 12.1 |
| 24 | $1 \times 10^{17}$ | $5 \times 10^{20}$ | 11.2 |
| 25 | $1 \times 10^{18}$ | $5 \times 10^{20}$ | 10.9 |
| 26* | $1 \times 10^{16}$ | $1 \times 10^{16}$ | 3.5 |
| 27* | $1 \times 10^{17}$ | $1 \times 10^{16}$ | 2.7 |
| 28* | $1 \times 10^{17}$ | $1 \times 10^{17}$ | 4.8 |
| 29* | $1 \times 10^{20}$ | $1 \times 10^{20}$ | 7.0 |
| 30* | $1 \times 10^{20}$ | $5 \times 10^{18}$ | 5.5 |

*Samples Nos. 26-30 are out of the scope of the present invention.

As can be seen from the results above, conversion efficiency is improved when n-type semiconductor layers 4 are formed before the formation of the insulator layer, and n-type semiconductor layers 4 have a gradient of phosphorus concentration such that the concentration is lower at regions on the side of the crystalline semiconductor particles.

Example 3

P-type crystalline silicon particles 3 with an average particle size of 400 μm were densely placed to form a layer on an aluminum substrate 1, which were then heated at 590-600° C. so that the crystalline semiconductor particles 3 were joined to the substrate 1.

Subsequently, with a substrate temperature of 150° C., n-type mixed crystal semiconductor layers 4 were formed by a plasma CVD method in which thickness at the zenith regions was varied by controlling the deposition time. Then, polyimide resin was provided among the silicon particles 3 and baked at 200° C. to form an insulator layer 2, on which a 90 nm upper electrode layer 5 comprising ITO was formed. Thereafter, conversion efficiency was measured, the results of which are shown in Table 4.

TABLE 4

| Sample No. | Thickness of n-type semiconductor layer 4 (nm) | Conversion efficiency (%) |
|---|---|---|
| 31* | 4 | 6.7 |
| 32 | 5 | 10.2 |
| 33 | 7 | 11.2 |
| 34 | 10 | 11.5 |
| 35 | 30 | 11.4 |
| 36 | 50 | 12.5 |
| 37 | 60 | 11.7 |
| 38 | 80 | 11.9 |
| 39 | 100 | 12.3 |
| 40* | 110 | 8.6 |
| 41* | 120 | 7.1 |

*Samples Nos. 31, 40 and 41 are out of the scope of the present invention.

As can be seen from the results above, the second conductivity-type semiconductor layers 4 preferably have a thickness of not less than 5 nm and not more than 100 nm.

Example 4

N-type mixed crystal semiconductor layers 4 were formed to a thickness of 30 nm on p-type silicon particles on a substrate by a plasma CVD method with a substrate temperature of 150° C. In this process, oxygen concentration was varied in the direction of thickness by regulating the amount of oxygen for doping. Then, polyimide resin was provided among the silicon particles 3 and baked at 200° C. to form an insulator layer 2, on which a 90 nm upper electrode layer 5 comprising ITO was formed. The fabricated samples were thereafter placed in an 80° C., 90% RH environment for 3000 hours, and thereafter, changes in electric property were measured and evaluated. Similar results were obtained for elements other than oxygen, including nitrogen, carbon and hydrogen.

TABLE 5

| Sample No. | Oxygen concentration in n-type semiconductor layer 4 on the side of semiconductor particle (atoms/cm$^3$) | Oxygen concentration in n-type semiconductor layer 4 on the side of upper electrode layer (atoms/cm$^3$) | Conversion efficiency (%) |
|---|---|---|---|
| 41 | $1 \times 10^{17}$ | $1 \times 10^{19}$ | 12.1 |
| 42 | $1 \times 10^{17}$ | $5 \times 10^{19}$ | 12.0 |
| 43 | $1 \times 10^{17}$ | $1 \times 10^{20}$ | 12.2 |
| 44 | $1 \times 10^{18}$ | $1 \times 10^{20}$ | 11.5 |
| 45 | $1 \times 10^{19}$ | $1 \times 10^{20}$ | 11.4 |
| 46* | $1 \times 10^{17}$ | $1 \times 10^{17}$ | 4.1 |
| 47* | $1 \times 10^{20}$ | $1 \times 10^{20}$ | 4.7 |
| 48* | $1 \times 10^{19}$ | $1 \times 10^{19}$ | 6.3 |
| 49* | $1 \times 10^{20}$ | $1 \times 10^{17}$ | 2.2 |
| 50* | $1 \times 10^{20}$ | $5 \times 10^{18}$ | 3.4 |

*Samples Nos. 46-50 are out of the scope of the present invention.

As is apparent from the results above, high conversion efficiency and good reliability are achieved when the n-type semiconductor layers 4 are formed before the formation of the insulator layer, and the n-type semiconductor layers 4 have lower oxygen concentrations on the side of the crystalline semiconductor particles.

What is claimed is:

1. A photoelectric conversion device comprising:
   a substrate serving as a lower electrode;
   first conductivity-type crystalline semiconductor particles deposited on the substrate;
   second conductivity-type semiconductor layers formed on the crystalline semiconductor particles;
   an insulator layer formed among the crystalline semiconductor particles; and
   an upper electrode layer formed on the second conductivity-type semiconductor layers,
   wherein the second conductivity-type semiconductor layers each have a smaller thickness at or below an equator of each of the crystalline semiconductor particles than at a zenith thereof.

2. The photoelectric conversion device according to claim 1, wherein the thickness of each of the second conductivity-type semiconductor layers on the crystalline semiconductor particles at or below the equator is 70% or less of that at the zenith thereof.

3. The photoelectric conversion device according to claim 1, wherein the thickness of each of the second conductivity-type semiconductor layers on the crystalline semiconductor particles at or below the equator is 40% or less of that at the zenith thereof.

4. The photoelectric conversion device according to claim 1, wherein the crystalline semiconductor particles each have an indentation toward the interior thereof at a surface below the equator.

5. The photoelectric conversion device according to claim 1, wherein the crystalline semiconductor particles have rough surfaces.

6. A photoelectric conversion device comprising:
   a substrate serving as a lower electrode;
   first conductivity-type crystalline semiconductor particles formed on the substrate;
   second conductivity-type semiconductor layers formed on the crystalline semiconductor particles;
   an insulator layer formed among the crystalline semiconductor particles; and
   an upper electrode layer formed on the second conductivity-type semiconductor layers, wherein the second conductivity-type semiconductor layers include an impurity element with a concentration decreasing with proximity to the crystalline semiconductor particles, wherein the impurity element comprises one element selected from the group consisting of nitrogen, carbon, and hydrogen.

7. The photoelectric conversion device according to claim 6, wherein the second conductivity-type semiconductor layers each have a thickness of not less than 5 nm and not more than 100 nm.

8. The photoelectric conversion device according to claim 6, wherein a region of each of the second conductivity-type semiconductor layers where the concentration of the impurity element is lowest comprises an intrinsic semiconductor.

9. The photoelectric conversion device according to claim 6, wherein an oxide layer or a nitride layer is formed between each of the crystalline semiconductor particles and the second conductivity-type semiconductor layers.

10. The photoelectric conversion device according to claim 6, wherein the substrate comprises aluminum or an aluminum alloy.

11. A method of manufacturing a photoelectric conversion device comprising the steps of:
depositing first conductivity-type crystalline semiconductor particles on a substrate serving as a lower electrode;
forming second conductivity-type semiconductor layers on the crystalline semiconductor particles so that at least one element selected from the group consisting of nitrogen, carbon and hydrogen is included in the semiconductor layers with a concentration increasing with thickness;
forming an insulator layer among the crystalline semiconductor particles; and
forming an upper electrode layer on the second conductivity-type semiconductor layers.

12. The method of manufacturing a photoelectric conversion device according to claim 11, further comprising, prior to forming the insulator layer among the crystalline semiconductor particles, the step of removing a part of the second conductivity-type semiconductor layers that adheres to the substrate after the formation of the second conductivity-type semiconductor layers.

13. The method of manufacturing a photoelectric conversion device according to claim 12, wherein the substrate comprises aluminum or an aluminum alloy, and the step of removing a part of the second conductivity-type semiconductor layers adhering to the substrate is implemented by etching with use of hydrofluoric acid, nitric acid, hydrochloric acid, sulfuric acid or phosphoric acid.

14. The photoelectric conversion device according to claim 6, wherein the second conductivity-type semiconductor layers on the semiconductor particles each have a smaller thickness at or below an equator of each of the semiconductor particles than at a zenith region thereof.

15. The photoelectric conversion device according to claim 14, wherein the thickness of each of the second conductivity-type semiconductor layers on the crystalline semiconductor particles at or below the equator is 70% or less of that at the zenith.

16. The photoelectric conversion device according to claim 14, wherein the thickness of each of the second conductivity-type semiconductor layers on the crystalline semiconductor particles at or below the equator is 40% or less of that at the zenith region.

17. The photoelectric conversion device according to claim 14, wherein the crystalline semiconductor particles each have an indentation toward the interior thereof at a surface below the equator.

18. The photoelectric conversion device according to claim 14, wherein the crystalline semiconductor particles have rough surfaces.

19. The photoelectric conversion device according to claim 6, wherein the second conductivity-type semiconductor layers further comprise a second impurity element selected from the group consisting of B, P, Al, As, and Sb, the second impurity having a concentration decreasing with proximity to the crystalline semiconductor particles.

20. A photoelectric conversion device comprising:
a first electrode;
a semiconductor region electrically connected to the first electrode; the semiconductor region comprising
a first conductivity-type semiconductor region having a three dimensional curved surface; and
a second conductivity-type semiconductor region surrounding at least a part of the curved surface; and
a second electrode electrically connected to the second conductivity-type semiconductor region,
wherein the second conductivity-type semiconductor region includes an impurity element comprising at least one element selected from the group consisting of nitrogen, carbon and hydrogen, wherein the impurity element has a lower concentration with proximity to the first conductivity-type semiconductor region than with proximity to the second electrode.

21. The photoelectric conversion device according to claim 20, wherein the impurity element has concentrations of $5 \times 10^{15}$ to $5 \times 10^{19}$ atoms/cm$^3$ on the lower side of the second conductivity-type semiconductor region, and concentrations of $1 \times 10^{18}$ to $5 \times 10^{21}$ atoms/cm$^3$ on the upper side of the second conductivity-type semiconductor region.

* * * * *